US007714607B2

(12) United States Patent
Nakajima

(10) Patent No.: US 7,714,607 B2
(45) Date of Patent: May 11, 2010

(54) RESISTOR CIRCUIT, INTERFACE CIRCUIT INCLUDING RESISTOR CIRCUIT, AND ELECTRONIC INSTRUMENT

(75) Inventor: Kiminori Nakajima, Suwa (JP)

(73) Assignee: Seiko Epson Corporation (JP)

( * ) Notice: Subject to any disclaimer, the term of this patent is extended or adjusted under 35 U.S.C. 154(b) by 100 days.

(21) Appl. No.: 11/973,623

(22) Filed: Oct. 9, 2007

(65) Prior Publication Data

US 2008/0252333 A1 Oct. 16, 2008

(30) Foreign Application Priority Data

Oct. 12, 2006 (JP) ............................ 2006-278402
Sep. 3, 2007 (JP) ............................ 2007-227580

(51) Int. Cl.
*H03K 17/16* (2006.01)
*H03K 19/003* (2006.01)

(52) U.S. Cl. ............................ 326/30; 326/83; 327/525

(58) Field of Classification Search .................. 326/30, 326/86, 87; 327/525
See application file for complete search history.

(56) References Cited

U.S. PATENT DOCUMENTS 7,135,884 B1 * 11/2006 Talbot et al. .................. 326/30
2007/0007994 A1 1/2007 Komatsu et al.

FOREIGN PATENT DOCUMENTS

JP 2003-270299 9/2003
JP 2007-019186 1/2007

* cited by examiner

*Primary Examiner*—Vibol Tan
*Assistant Examiner*—Jany Tran
(74) *Attorney, Agent, or Firm*—Harness, Dickey & Pierce, P.L.C.

(57) ABSTRACT

A resistor circuit includes n-stage unit circuits, each of which includes a first resistor element provided between first and second terminals, a first disconnection element provided between the second and third terminals, and a second disconnection element and a second resistor element provided in series between the second and fourth terminals. The first terminal of each of the n-stage unit circuits is connected with a first interconnect, the fourth terminal of each of the n-stage unit circuits is connected with a second interconnect, the third terminal of the first-stage unit circuit is connected with a third interconnect, and the third terminal of the mth-stage unit circuit is connected with the second terminal of the (m−1)th-stage unit circuit.

20 Claims, 10 Drawing Sheets

RESISTOR CIRCUIT, INTERFACE CIRCUIT INCLUDING RESISTOR CIRCUIT, AND ELECTRONIC INSTRUMENT

Japanese Patent Application No. 2006-278402 filed on Oct. 12, 2006, and Japanese Patent Application No. 2007-227580 filed on Sep. 3, 2007, are hereby incorporated by reference in their entirety.

BACKGROUND OF THE INVENTION

The present invention relates to a resistor circuit, an interface circuit including a resistor circuit, and an electronic instrument.

JP-A-2003-270299 discloses related-art technology in which a terminating resistor for impedance matching is provided in a receiver circuit, for example. Such a terminating resistor is generally provided as an external part of an integrated circuit (IC) device on a circuit board or the like on which the integrated circuit device is mounted.

However, when incorporating a high-speed serial interface circuit in a driver IC or the like, it is difficult to externally provide such a terminating resistor due to limitations on mounting of the driver IC.

A serial interface circuit conforming to Universal Serial Bus (USB), IEEE1394, or the like is known as a high-speed serial interface circuit. Such a serial interface circuit may include a terminating resistor, but is not designed taking into account the effects of interconnect parasitic resistance and the like. A method may be considered in which a terminating resistor is accurately adjusted using a fuse element in order to substantially disregard the effects of such a parasitic resistance.

However, this method has a problem in that the number of fuse blowing steps increases along with an increase in the number of resistor stages, whereby it takes time to adjust the resistance value.

SUMMARY

According to one aspect of the invention, there is provided a resistor circuit comprising:

n-stage (n is a positive integer equal to or larger than two) unit circuits, each of the n-stage unit circuits including:

a first resistor element provided between a first terminal and a second terminal;

a first disconnection element provided between the second terminal and a third terminal; and a second disconnection element and a second resistor element provided in series between the second terminal and a fourth terminal;

the first terminal of each of the n-stage unit circuits being connected with a first interconnect;

the fourth terminal of each of the n-stage unit circuits being connected with a second interconnect;

the third terminal of a first-stage unit circuit of the n-stage unit circuits being connected with a third interconnect; and the third terminal of an mth-stage (m is a positive integer satisfying $2 \leqq m \leqq n$) unit circuit of the n-stage unit circuits being connected with the second terminal of an (m−1)th-stage unit circuit of the n-stage unit circuits.

According to another aspect of the invention, there is provided an interface circuit comprising:

the above resistor circuit;

a comparator circuit which includes a first input terminal and a second input terminal and in which the resistor circuit serving as a terminating resistor is provided between the first input terminal and the second input terminal;

a third resistor element provided between the first input terminal of the comparator circuit and the third interconnect;

a fourth resistor element provided between the second input terminal of the comparator circuit and the third interconnect; and a capacitor element provided between the third interconnect and a ground potential line.

According to a further aspect of the invention, there is provided an interface circuit comprising:

a resistor circuit including n-stage (n is a positive integer equal to or larger than two) unit circuits, each of the n-stage unit circuits including first and second disconnection elements, a first resistor element of which one end is connected with a first interconnect and the other end is connected with one end of the first disconnection element, and a second resistor element of which one end is connected with a second interconnect and the other end is connected with one end of the second disconnection element;

a comparator circuit which includes a first input terminal and a second input terminal and in which the resistor circuit serving as a terminating resistor is provided between the first input terminal and the second input terminal;

a third resistor element provided between the first input terminal of the comparator circuit and a third interconnect;

a fourth resistor element provided between the second input terminal of the comparator circuit and the third interconnect; and a capacitor element provided between the third interconnect and a ground potential line;

the first disconnection elements of the n-stage unit circuits being disposed in a first disconnection element area;

the second disconnection elements of the n-stage unit circuits being disposed in a second disconnection element area; and the capacitor element being disposed in a capacitor element area provided between the first disconnection element area and the second disconnection element area.

According to still another aspect of the invention, there is provided an electronic instrument comprising the above interface circuit.

BRIEF DESCRIPTION OF THE SEVERAL VIEWS OF THE DRAWING

FIG. 9 shows a further detailed layout arrangement example of a disconnection element area, a resistor element area, and the like.

DETAILED DESCRIPTION OF THE EMBODIMENT

Figure 1:
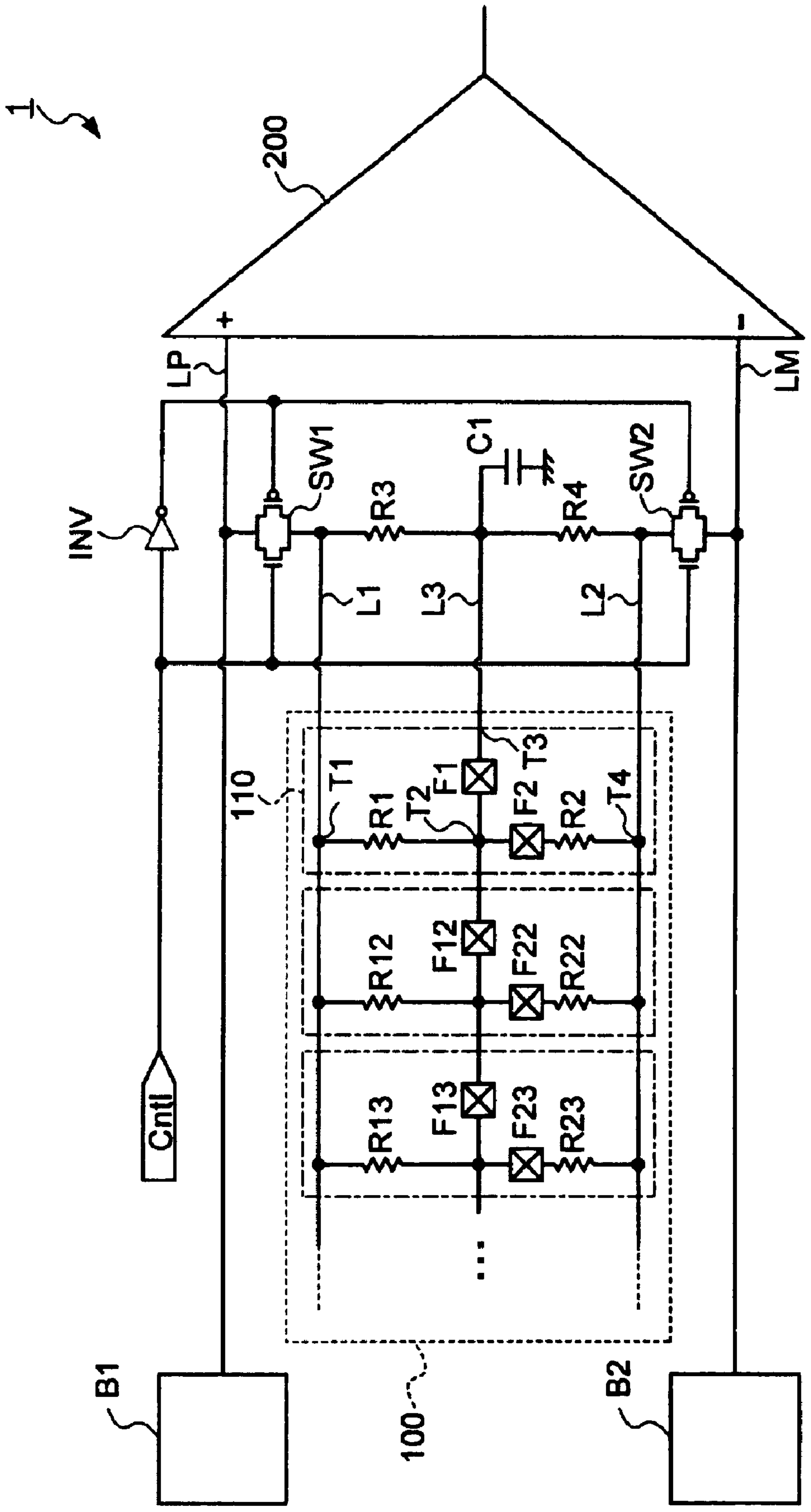
FIG. 1 shows a first configuration example of an interface circuit according to one embodiment of the invention.

Aspects of the invention may provide a resistor circuit, an interface circuit, and an electronic instrument enabling an efficient resistance value adjustment.

According to one embodiment of the invention, there is provided a resistor circuit comprising:

n-stage (n is a positive integer equal to or larger than two) unit circuits, each of the n-stage unit circuits including:

a first resistor element provided between a first terminal and a second terminal;

a first disconnection element provided between the second terminal and a third terminal; and a second disconnection element and a second resistor element provided in series between the second terminal and a fourth terminal;

the first terminal of each of the n-stage unit circuits being connected with a first interconnect;

the fourth terminal of each of the n-stage unit circuits being connected with a second interconnect;

the third terminal of a first-stage unit circuit of the n-stage unit circuits being connected with a third interconnect; and the third terminal of an mth-stage (m is a positive integer satisfying $2 \leqq m \leqq n$) unit circuit of the n-stage unit circuits being connected with the second terminal of an (m−1)th-stage unit circuit of the n-stage unit circuits.

According to this embodiment, when disconnecting the first resistor elements and the second resistor elements in the mth and subsequent stages included in the resistor circuit including the n-stage unit circuits connected with the first interconnect, the second interconnect, and the third interconnect, since it suffices to blow the (n−m+2) disconnection elements (i.e., the sum of the first disconnection element in the mth stage and the second disconnection elements in the mth to nth stages), the resistance value can be efficiently adjusted with a reduced number of blowing steps.

In the resistor circuit, the first resistor elements of the n-stage unit circuits may be disposed in a first resistor element area;

the second resistor elements of the n-stage unit circuits may be disposed in a second resistor element area;

the first disconnection elements of the n-stage unit circuits may be disposed in a first disconnection element area;

the second disconnection elements of the n-stage unit circuits may be disposed in a second disconnection element area;

the first resistor element area and the second resistor element area may be provided along a first direction;

the first disconnection element area and the second disconnection element area may be provided along the first direction; and when a direction perpendicular to the first direction is a second direction, the first disconnection element area may be provided on the second direction side of the first resistor element area, and the second disconnection element area may be provided on the second direction side of the second resistor element area.

According to this configuration, since the first and second disconnection element areas are disposed along the first direction, the efficiency of the disconnection element blowing steps in these areas can be increased. Moreover, since the first disconnection element area is provided on the second direction side of the first resistor element area and the second disconnection element area is provided on the second direction side of the second resistor element area, these areas can be interconnected through a short signal path, whereby the layout efficiency can be increased.

According to another embodiment of the invention, there is provided an interface circuit comprising:

the above resistor circuit;

a comparator circuit which includes a first input terminal and a second input terminal and in which the resistor circuit serving as a terminating resistor is provided between the first input terminal and the second input terminal;

a third resistor element provided between the first input terminal of the comparator circuit and the third interconnect;

a fourth resistor element provided between the second input terminal of the comparator circuit and the third interconnect; and a capacitor element provided between the third interconnect and a ground potential line.

According to this configuration, resistance-adjustment base resistors of the resistor circuit and the like can be implemented by the third and fourth resistor elements.

The interface circuit may comprise:

a first switching element provided between the first input terminal of the comparator circuit and the first interconnect; and a second switching element provided between the second input terminal of the comparator circuit and the second interconnect;

wherein the third resistor element may be provided between the first interconnect and the third interconnect; and wherein the fourth resistor element may be provided between the second interconnect and the third interconnect.

This enables the resistor circuit to be disconnected by turning OFF (nonconducting state) the first switching element and the second switching element.

The interface circuit may comprise:

a fifth resistor element provided between the first input terminal of the comparator circuit and a first external terminal; and a sixth resistor element provided between the second input terminal of the comparator circuit and a second external terminal.

According to this configuration, even if the first switching element and the second switching element are turned OFF, the fifth resistor element between the first input terminal of the comparator circuit and the first external terminal and the sixth resistor element between the second input terminal of the comparator circuit and the second external terminal can function as terminating resistors. Moreover, when static electricity is applied through the first and second external terminals, for example, a situation in which the first and second switching elements are destroyed due to static electricity can be effectively prevented.

The interface circuit may comprise:

a first single-ended receiver circuit connected with the first input terminal of the comparator circuit; and a second single-ended receiver circuit connected with the second input terminal of the comparator circuit;

wherein the comparator circuit may form a differential receiver circuit; and wherein the first and second switching elements may be turned ON when the differential receiver circuit receives signals, and may be turned OFF when the first and second single-ended receiver circuits receive signals.

According to this configuration, the resistor circuit can be used as the terminating resistor in a transfer mode using the differential receiver circuit, and a situation in which the resistor circuit hinders transfer can be prevented in a transfer mode using the first and second single-ended receiver circuits.

The interface circuit may comprise:

a first switching element provided between the first interconnect and the third interconnect; and a second switching element provided between the second interconnect and the third interconnect;

wherein the third resistor element may be provided between the first input terminal of the comparator circuit and the first interconnect; and wherein the fourth resistor element may be provided between the second input terminal of the comparator circuit and the second interconnect.

According to this configuration, the third and fourth resistor elements can be utilized as resistance-adjustment base resistors of the resistor circuit, and can also be utilized as electrostatic breakdown prevention resistors for the first and second switching elements.

In the interface circuit, the first disconnection elements of the n-stage unit circuits may be disposed in a first disconnection element area;

the second disconnection elements of the n-stage unit circuits may be disposed in a second disconnection element area; and the capacitor element may be disposed in a capacitor element area provided between the first disconnection element area and the second disconnection element area.

According to a further embodiment of the invention, there is provided an interface circuit comprising:

a resistor circuit including n-stage (n is a positive integer equal to or larger than two) unit circuits, each of the n-stage unit circuits including first and second disconnection elements, a first resistor element of which one end is connected with a first interconnect and the other end is connected with one end of the first disconnection element, and a second resistor element of which one end is connected with a second interconnect and the other end is connected with one end of the second disconnection element;

a comparator circuit which includes a first input terminal and a second input terminal and in which the resistor circuit serving as a terminating resistor is provided between the first input terminal and the second input terminal;

a third resistor element provided between the first input terminal of the comparator circuit and a third interconnect;

a fourth resistor element provided between the second input terminal of the comparator circuit and the third interconnect; and a capacitor element provided between the third interconnect and a ground potential line;

the first disconnection elements of the n-stage unit circuits being disposed in a first disconnection element area;

the second disconnection elements of the n-stage unit circuits being disposed in a second disconnection element area; and the capacitor element being disposed in a capacitor element area provided between the first disconnection element area and the second disconnection element area.

According to this embodiment, the resistance value of the resistor circuit can be adjusted by disconnecting the first and second resistor elements included in the unit circuits by blowing the first and second disconnection elements. According to this embodiment, since the capacitor element can be disposed while effectively utilizing the free space between the first and second disconnection element areas, the layout efficiency can be increased.

In the interface circuit, the first resistor elements of the n-stage unit circuits may be disposed in a first resistor element area;

the second resistor elements of the n-stage unit circuits may be disposed in a second resistor element area;

the first resistor element area and the second resistor element area may be provided along a first direction;

the first disconnection element area and the second disconnection element area may be provided along the first direction; and when a direction perpendicular to the first direction is a second direction, the first disconnection element area may be provided on the second direction side of the first resistor element area, and the second disconnection element area may be provided on the second direction side of the second resistor element area.

According to this configuration, since the first and second disconnection element areas are disposed along the first direction, the efficiency of the disconnection element blowing steps in these areas can be increased. Moreover, since the first disconnection element area is provided on the second direction side of the first resistor element area and the second disconnection element area is provided on the second direction side of the second resistor element area, these areas can be connected through a short signal path, whereby the layout efficiency can be increased.

In the interface circuit, when a direction opposite to the second direction is a fourth direction, the third and fourth resistor elements may be respectively disposed in third and fourth resistor element areas provided on the fourth direction side of the capacitor element area.

According to this configuration, since the third and fourth resistor elements can be disposed while effectively utilizing the free space on the fourth direction side of the capacitor element area, the layout efficiency can be increased.

In the interface circuit, the comparator circuit may be disposed in an analog circuit area provided on the second direction side of the capacitor element area.

According to this configuration, since the elements and the circuits forming the resistor circuit and the elements and the circuits forming the analog circuit can be separately disposed in different areas, it is possible to achieve an increase in layout efficiency, prevention of deterioration in analog circuit characteristics, and the like.

According to still another embodiment of the invention, there is provided an electronic instrument comprising one of the above interface circuits.

According to this embodiment, an electronic instrument can be provided in which the resistance value of the terminating resistor for which absolute accuracy is required can be efficiently adjusted with a reduced number of disconnection element blowing steps.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention.

1. First Configuration Example

FIG. 1 shows a first configuration example of an interface circuit according to this embodiment. Note that the configuration of the interface circuit according to this embodiment is not limited to the configuration shown in FIG. 1. Various modifications may be made such as omitting some elements (e.g. capacitor element or switching element) or adding other elements.

An interface circuit 1 shown in FIG. 1 includes a resistor circuit 100 and a comparator circuit 200. The interface circuit 1 may also include a transmission gate SW1 (first switching element in a broad sense), a transmission gate SW2 (second switching element in a broad sense), a capacitor C1 (capacitor element in a broad sense), a resistor R3 (third resistor element in a broad sense), and a resistor R4 (fourth resistor element in a broad sense). In FIG. 1, the interface circuit 1 also includes a bump B1 (first external terminal in a broad sense), a bump B2 (second external terminal in a broad sense), and an inverter INV. First and second signals (DP and DM) forming differential signals are input through the bumps B1 and B2 (pads). An inversion signal of a control signal Cntl is generated using the inverter INV.

The comparator circuit 200 (differential amplifier) includes a non-inverting input terminal (first input terminal in a broad sense) and an inverting input terminal (second input terminal in a broad sense). The resistor circuit 100 serving as a terminating resistor is provided between the non-inverting input terminal (+) and the inverting input terminal (−) of the comparator circuit 200. The bump B1 and the non-inverting input terminal of the comparator circuit 200 are connected through an interconnect LP, and the bump B2 and the inverting input terminal of the comparator circuit 200 are connected through an interconnect LM.

The resistor R3 (third resistor element) is provided between the non-inverting input terminal (interconnect LP) of the comparator circuit 200 and an interconnect L3 (third interconnect) of the resistor circuit 100. The resistor R4 (fourth resistor element) is provided between the inverting input terminal (interconnect LM) of the comparator circuit 200 and the interconnect L3 of the resistor circuit 100. The capacitor C1 (capacitor element) is provided between the interconnect L3 and a ground potential line (first power supply line). The capacitor C1 is used as a center-tap capacitor for removing (filtering) common-mode noise. A modification may also be made in which the capacitor C1 is omitted.

In FIG. 1, the transmission gate SW1 (first switching element) is provided between the non-inverting input terminal (interconnect LP) of the comparator circuit 200 and an interconnect L1 (first interconnect) of the resistor circuit 100. The transmission gate SW2 (second switching element) is provided between the inverting input terminal (interconnect LM) of the comparator circuit 200 and an interconnect L2 (second interconnect) of the resistor circuit 100. The resistor R3 is provided between the interconnects L1 and L3. The resistor R4 is provided between the interconnects L2 and L3.

The control signal Cntl from the outside is input to the gates of N-type (first conductivity type) transistors forming the transmission gates SW1 and SW2. A signal obtained by inverting the control signal Cntl using the inverter INV is input to the gates of P-type (second conductivity type) transistors forming the transmission gates SW1 and SW2.

The resistor circuit 100 includes n-stage (n is an integer equal to or larger than two) unit circuits 110. Specifically, the resistor circuit 100 is formed by connecting the n-stage (two or more) unit circuits 110 in parallel between the interconnects L1 and L2. Each unit circuit 110 includes a resistor R1 (first resistor element in a broad sense), a resistor R2 (second resistor element in a broad sense), a fuse F1 (first disconnection element in a broad sense), and a fuse F2 (second disconnection element in a broad sense).

The resistor R1 is provided between a first terminal T1 and a second terminal T2 of the unit circuit 110. The fuse F1 is provided between the second terminal T2 and a third terminal T3 of the unit circuit 110. The resistor R2 and the fuse F2 are provided in series between a fourth terminal T4 and the second terminal T2 of the unit circuit 110.

The first terminal T1 of each of the n-stage unit circuits 110 is connected with the interconnect L1, and the fourth terminal T4 of each of the n-stage unit circuits 110 is connected with the interconnect L2. The third terminal T3 of the first-stage unit circuit 110 is connected with the interconnect L3. The third terminal T3 of the second-stage unit circuit 110 is connected with the second terminal T2 of the first-stage unit circuit 110. The third terminal T3 of the third-stage unit circuit 110 is connected with the second terminal T2 of the second-stage unit circuit 110. Likewise, the third terminal T3 of the mth-stage ($2 \leqq m \leqq n$) unit circuit 110 is connected with the second terminal T2 of the (m−1)th-stage unit circuit 110.

The above-described embodiment has the following effects.

Figure 4:
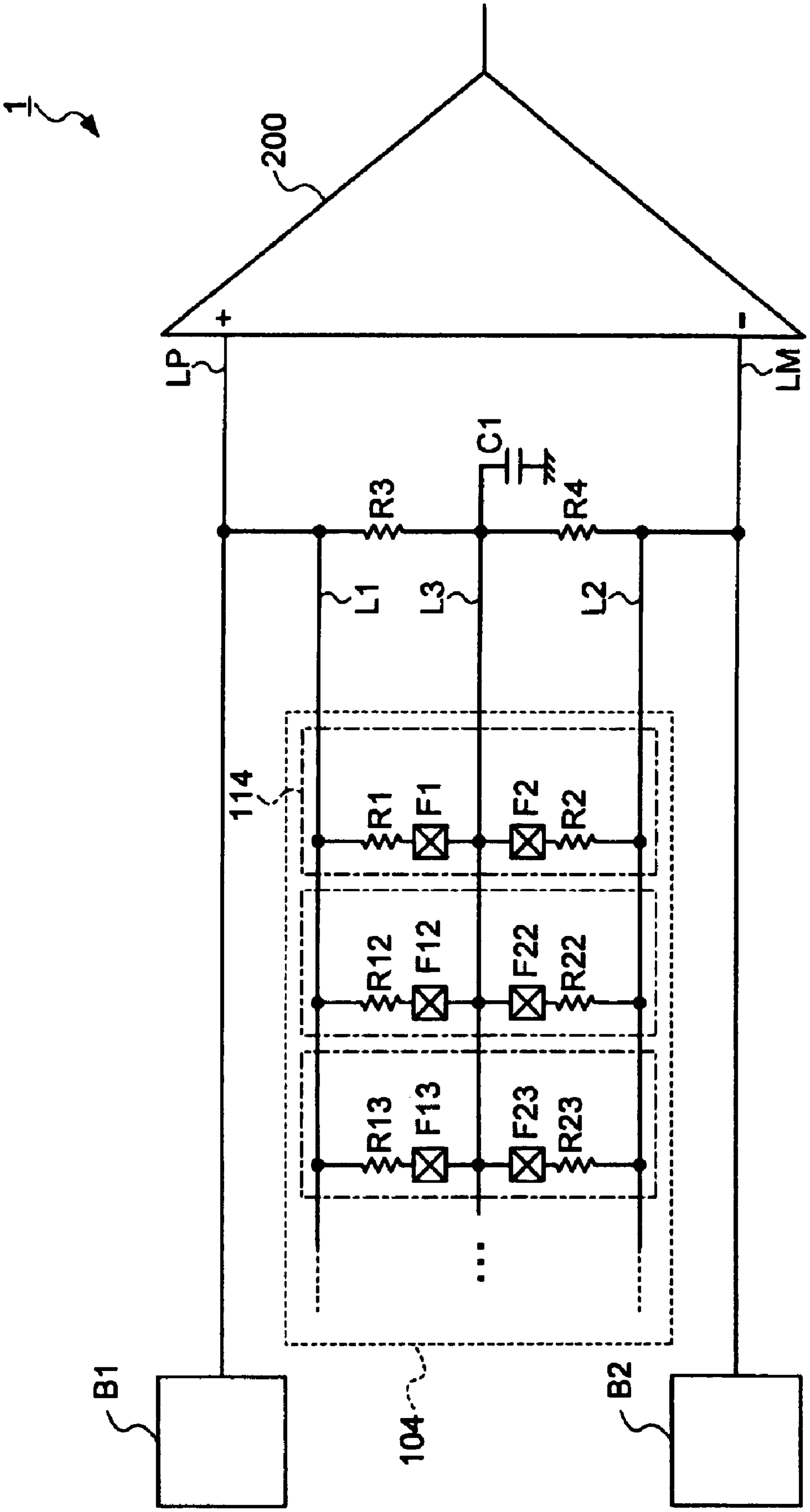
FIG. 4 shows a configuration example of an interface circuit according to a comparative example.

FIG. 4 shows a comparative example of an interface circuit. As shown in FIG. 4, a resistor circuit 104 forming an interface circuit 1 according to the comparative example includes n-stage unit circuits 114. In the unit circuit 114, a resistor R1 and a fuse F1 are connected in series between interconnects L1 and L3, and a resistor R2 and a fuse F2 are connected in series between interconnects L2 and L3.

According to this comparative example, when disconnecting the unit circuits 114 in the mth ($2 \leqq m \leqq n$) and subsequent stages, it is necessary to blow $(n-m+1)\times 2$ fuses. For example, when n=3 and m=2, it is necessary to blow $(n-m+1)\times 2=4$ fuses (F12, F13, F22, and F23 in FIG. 4). When n=10 and m=5, it is necessary to blow $(n-m+1)\times 2=12$ fuses.

In the resistor circuit 100 according to this embodiment shown in FIG. 1, when disconnecting the unit circuits 114 in the mth ($2 \leqq m \leqq n$) and subsequent stages, it suffices to blow the fuse F1 (F12 and F13) in the mth stage and blow (n−m+1) fuses F2 (F22 and F23) in the mth and subsequent stages. Accordingly, the unit circuits 110 can be disconnected by blowing (n−m+2) fuses in total, whereby the number of fuse blowing steps can be reduced by (n−m) as compared with the comparative example shown in FIG. 4. For example, when n=3 and m=2, it suffices to blow (n−m+2)=3 fuses (F12, F13, and F22 in FIG. 1) in the embodiment shown in FIG. 1. When n=10 and m=5, it suffices to blow (n−m+2)=7 fuses. Therefore, the number of fuse blowing steps can be significantly reduced as compared with the comparative example (i.e., number of fuse blowing steps is 12). Specifically, the interface circuit according to this embodiment has an advantage over the comparative example with respect to the number of fuse blowing steps as the number of stages of unit circuits 110 increases.

As described above, according to this embodiment, the resistance value of the terminating resistor for which absolute accuracy is required can be efficiently adjusted with a reduced number of fuse blowing steps.

2. Second Configuration Example

Figure 2:
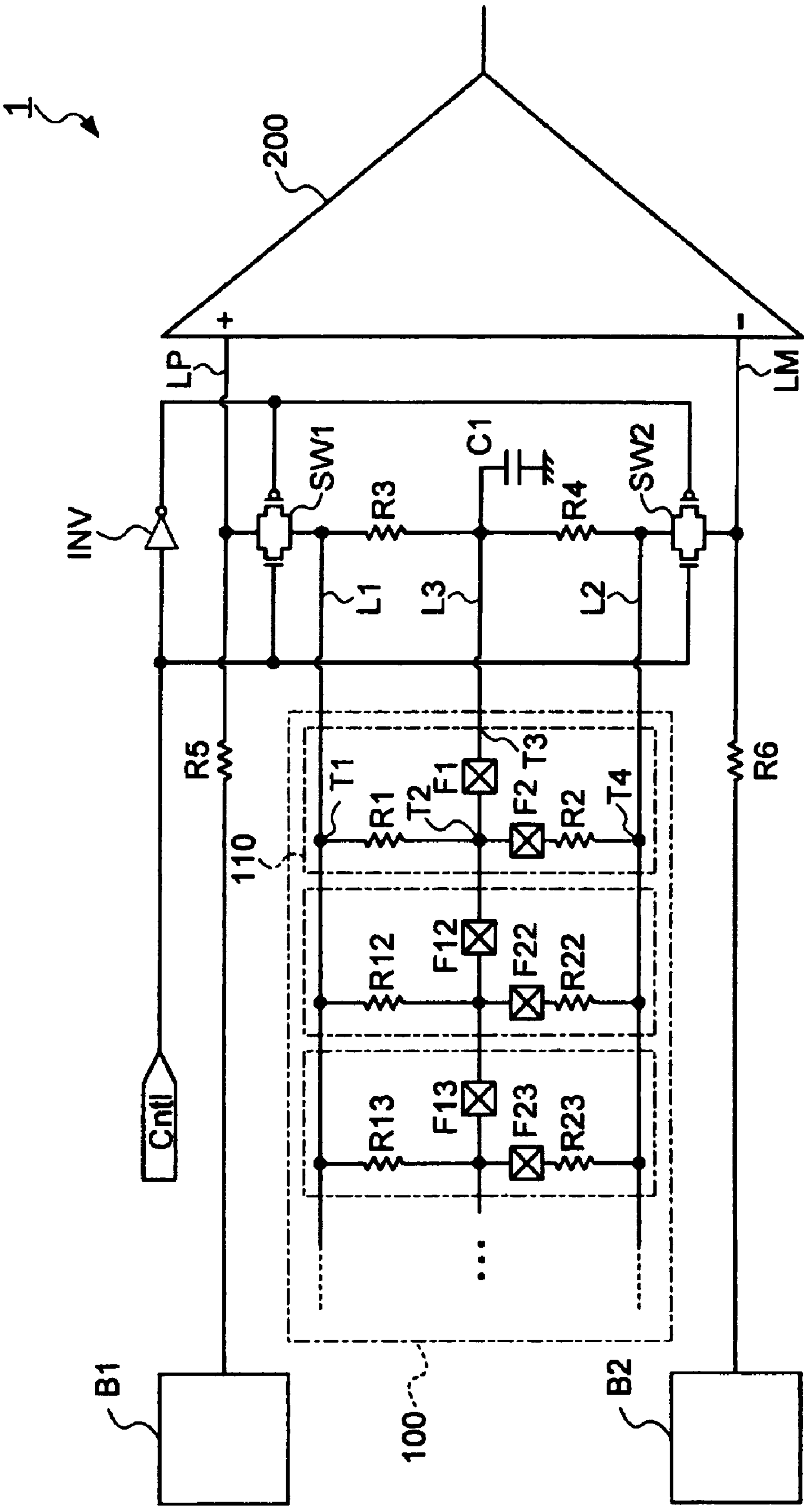
FIG. 2 shows a second configuration example of an interface circuit according to one embodiment of the invention.

FIG. 2 shows a second configuration example of the interface circuit according to this embodiment. In FIG. 2, resistors R5 and R6 (fifth and sixth resistor elements in a broad sense) are added to the configuration shown in FIG. 2.

In FIG. 2, the resistor R5 is provided between the non-inverting input terminal of the comparator circuit 200 and the bump B1 (first external input terminal), and the resistor R6 is provided between the inverting input terminal of the comparator circuit 200 and the bump B2 (second external input terminal). Specifically, the resistor R5 is connected with the interconnect LP, and the resistor R6 is connected with the interconnect LM.

According to the configuration shown in FIG. 2, even if the transmission gates SW1 and SW2 are turned OFF, the resistors R5 and R6 can function as terminating resistors. Moreover, when static electricity is applied through the bumps B1 and B2, the resistors R5 and R6 serve as protective resistors to protect the internal circuit from electrostatic breakdown.

3. Third Configuration Example

Figure 3:
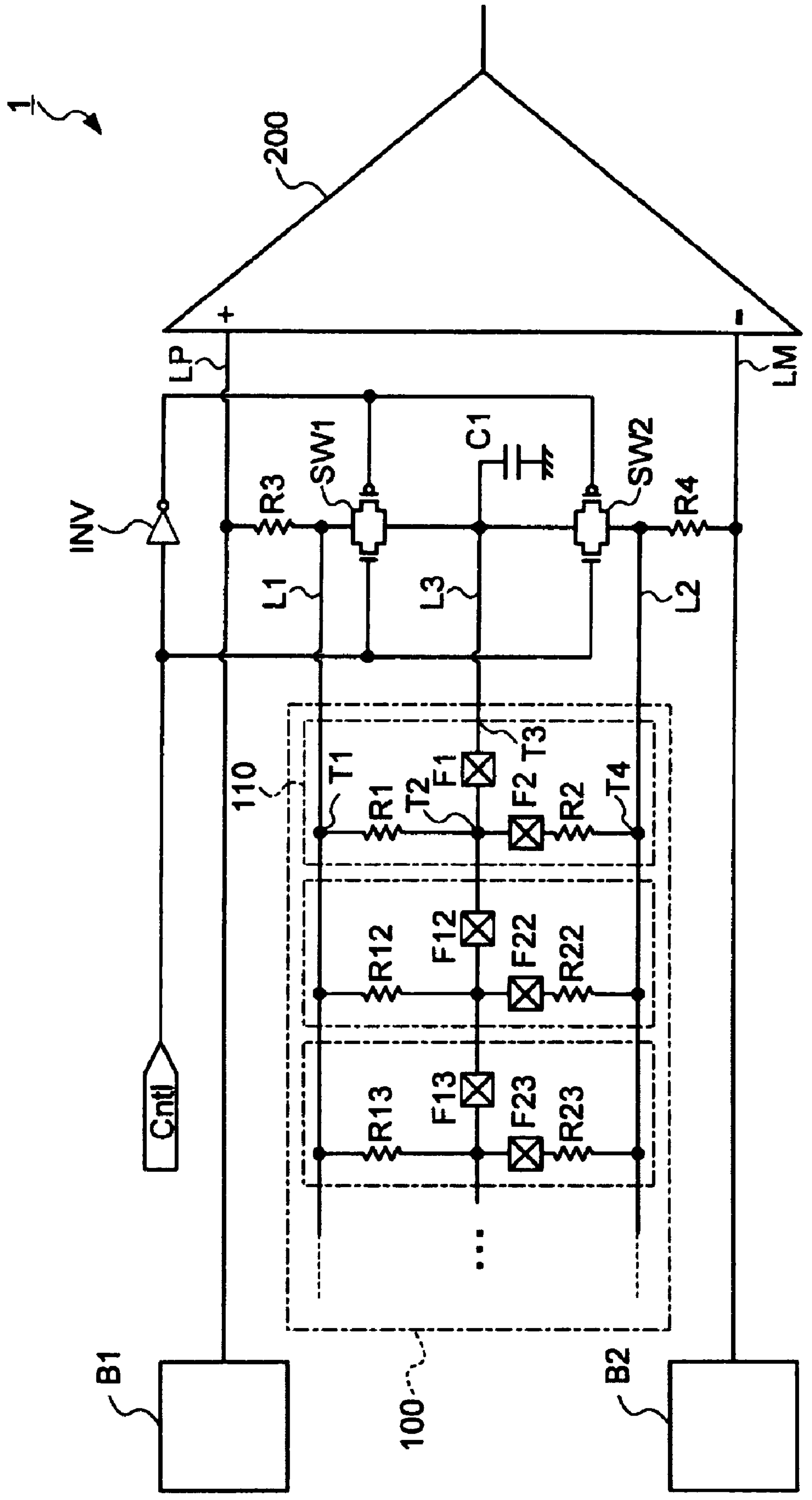
FIG. 3 shows a third configuration example of an interface circuit according to one embodiment of the invention.

FIG. 3 shows a third configuration example of the interface circuit according to this embodiment. FIG. 3 differs from FIG. 1 as to the order of the connection of the transmission gate SW1 and the resistor R3 and the order of the connection of the transmission gate SW2 and the resistor R4.

In FIG. 3, the transmission gate SW1 (first switching element) is provided between the interconnects L1 and L3 of the resistor circuit 100, and the transmission gate SW2 (second switching element) is provided between the interconnects L2 and L3 of the resistor circuit 100. The resistor R3 (third resistor element) is provided between the non-inverting input terminal (interconnect LP) of the comparator circuit 200 and the interconnect L1, and the resistor R4 (fourth resistor element) is provided between the inverting input terminal (interconnect LM) of the comparator circuit 200 and the interconnect L2. In FIG. 1, the transmission gate SW1, the resistor R3, the resistor R4, and the transmission gate SW2 are serially connected in that order between the interconnects LP and LM. In FIG. 3, the resistor R3, the transmission gate SW1, the transmission gate SW2, and the resistor R4 are serially connected in that order between the interconnects LP and LM.

According to the configuration shown in FIG. 3, since the resistor R3 is provided between the interconnects LP and L1 and the resistor R4 is provided between the interconnects LM and L2, the resistors R3 and R4 serve as protective resistors when static electricity is applied to the bumps B1 and B2, for example, whereby electrostatic breakdown of the transmission gates SW1 and SW2 can be prevented. Specifically, the resistors R3 and R4 can function as resistance-adjustment base resistors of the resistor circuit 100 and electrostatic discharge protection elements for the transmission gates SW1 and SW2.

4. Specific Circuit Configuration of Interface Circuit

Figure 5:
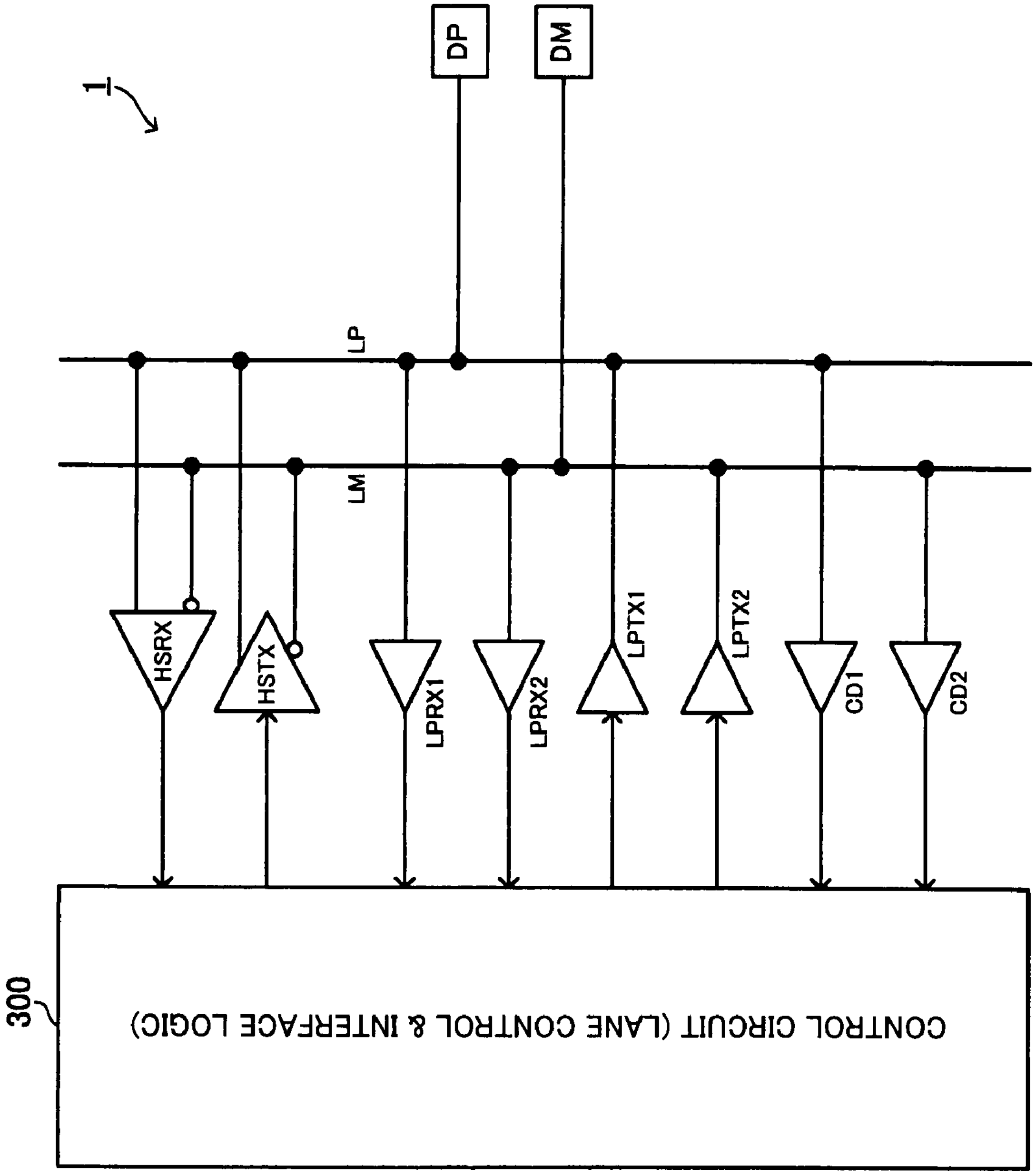
FIG. 5 shows a specific circuit configuration example of an interface circuit according to one embodiment of the invention.

FIG. 5 shows a specific circuit configuration example of the interface circuit 1 according to this embodiment. The interface circuit 1 includes a differential receiver circuit HSRX and first and second single-ended receiver circuits LPRX1 and LPRX2. The interface circuit 1 may also include a differential transmitter circuit HSTX, first and second single-ended transmitter circuits LPTX1 and LPTX2, first and second contention detection circuits CD1 and CD2, and a control circuit 300.

The differential receiver circuit HSRX and the differential transmitter circuit HSTX are circuits for high-speed signal transfer (e.g. 80 to 1000 Mbps) with a small voltage amplitude (e.g. 200 mV), and are used for high-speed data transfer and the like. Specifically, these circuits perform low voltage differential signaling (LVDS) data transfer using differential signals. For example, the differential receiver circuit HSRX receives and amplifies the differential signals DP and DM, and the differential transmitter circuit HSTX transmits the differential signals DP and DM.

When high-speed mode data transfer is unidirectional instead of bi-directional, the differential transmitter circuit HSTX is provided only on a master side, and the differential receiver circuit HSRX is provided only on a slave side. When transferring a clock signal using the configuration shown in FIG. 5, a master-side clock signal transfer differential transmitter circuit transmits differential clock signals, and a slave-side clock signal transfer differential receiver circuit amplifies the differential clock signals to reproduce the clock signal. A data sampling clock signal is generated based on the reproduced clock signal.

The first and second single-ended receiver circuits LPRX1 and LPRX2 and the first and second single-ended transmitter circuits LPTX1 and LPTX2 are circuits for transferring a signal with a large voltage amplitude (e.g. 1.2 V), and are mainly used for control. The input of the receiver circuit LPRX1 and the output of the transmitter circuit LPTX1 are connected with a DP signal line, and the input of the receiver circuit LPRX2 and the output of the transmitter circuit LPTX2 are connected with a DM signal line.

Figure 6:
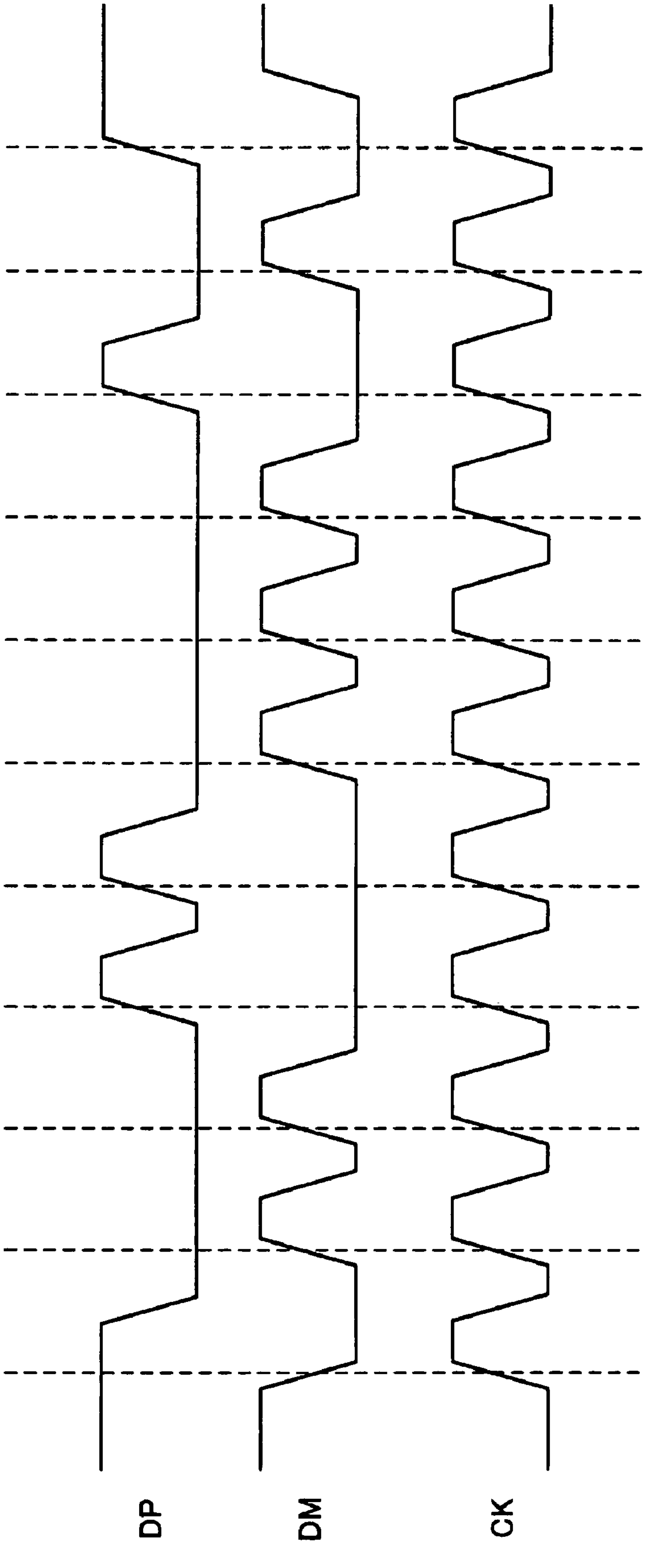
FIG. 6 shows a signal waveform example illustrative of a data and clock signal transfer in a low-speed mode.

FIG. 6 shows a data/clock signal transfer signal waveform example using these single-ended circuits, for example. In FIG. 6, data is transferred using the signals DP and DM. A clock signal is extracted by calculating the exclusive OR of the signals DP and DM. A data sampling clock signal is generated based on the extracted clock signal. In FIG. 5, the single-ended receiver circuits LPRX1 and LPRX2 which receive the signals DP and DM are provided for such clock signal extraction.

The contention detection circuits CD1 and CD2 are circuits for detecting a bus contention error. Specifically, the contention detection circuits CD1 and CD2 detect a state in which the DP or DM signal line (lane) is simultaneously driven by the master side and the slave side, a state in which the signal lines are not driven, or the like.

The control circuit 300 is a logic circuit which performs a lane control process and an interface process. Specifically, the control circuit 300 may include a serial/parallel conversion circuit, a data sampling circuit, a parallel/serial conversion circuit, a transmission control circuit, a state machine, an error detection circuit, a data/interface circuit, a control/interface circuit, and the like.

The differential receiver circuit HSRX shown in FIG. 5 is formed of the comparator circuit 200 (comparator or differential amplifier) shown in FIG. 1 or the like. The resistor circuit 100 functioning as a terminating resistor during high-speed transfer is provided between the non-inverting input terminal and the inverting input terminal of the differential receiver circuit HSRX.

The first single-ended receiver circuit LPRX1 is connected with the non-inverting input terminal (first input terminal; interconnect LP for the signal DP) of the comparator circuit 200 (HSRX). The second single-ended receiver circuit LPRX2 is connected with the inverting input terminal (second input terminal; interconnect LM for the signal DM) of the comparator circuit 200.

Therefore, when the transmission gates SW1 and SW2 shown in FIG. 1 are turned ON (conducting state) during low-speed mode transfer using the receiver circuits LPRX1 and LPRX2, an inappropriate current flows through the transmission gates SW1 and SW2, whereby a problem may occur during low-speed mode transfer.

In FIG. 1, the transmission gates SW1 and SW2 are provided for disconnecting the resistor circuit 100 from the interconnects LP and LM. Specifically, when the differential receiver circuit HSRX receives signals (data or clock signals) (high-speed mode), the transmission gates SW1 and SW2 (first and second switching elements) are turned ON (signal Cntl is activated). On the other hand, when the single-ended receiver circuits LPRX1 and LPRX2 receive signals (low-speed mode), the transmission gates SW1 and SW2 are turned OFF (signal Cntl is inactivated). This effectively prevents a situation in which a problem occurs in the low-speed mode due to an inappropriate current flowing through the transmission gates SW1 and SW2.

In this case, since the transmission gates SW1 and SW2 are directly connected with the bumps B1 and B2 (DP and DM) as the external terminals, the transmission gates SW1 and SW2 may be destroyed due to static electricity. According to the configuration shown in FIG. 3, for example, the resistors R3 and R4 provided between the bumps B1 and B2 and the transmission gates SW1 and SW2 function as protective resistors, whereby electrostatic breakdown can be prevented.

5. Layout Arrangement

Figure 7:
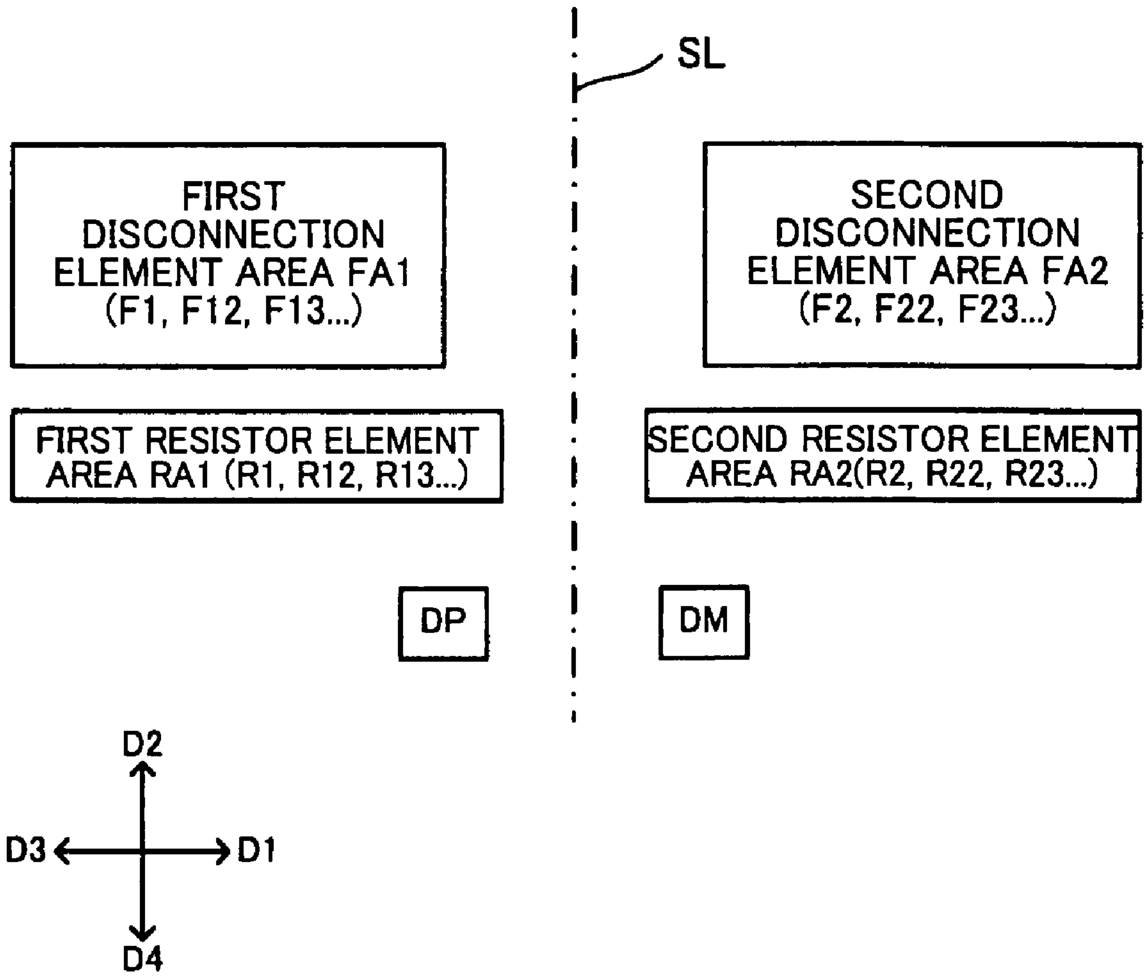
FIG. 7 shows a layout arrangement example of a resistor circuit.

The layout arrangement of the interface circuit 1 and the resistor circuit 100 according to this embodiment is described below. FIG. 7 shows a layout arrangement example of the resistor circuit 100.

In FIG. 7, the resistors R1, R12, R13, . . . (first resistor elements) of the unit circuits 110 are disposed in a first resistor element area RA1. The resistors R2, R22, R23, . . . (second resistor elements) of the unit circuits 110 are disposed in a second resistor element area RA2. The fuses F1, F12, F13, . . . (first disconnection elements) of the unit circuits 110 are disposed in a first disconnection element area FA1. The fuses F2, F22, F23, . . . (second disconnection elements) of the unit circuits 110 are disposed in a second disconnection element area FA2.

As shown in FIG. 7, the first and second resistor element areas RA1 and RA2 are provided along a direction D1 (first direction), and the first and second disconnection element areas FA1 and FA2 are also provided along the direction D1. The direction D1 is the direction in which the DP and DM pads (bumps B1 and B2) are arranged, for example.

When the direction perpendicular to the direction Dl is referred to as a direction D2 (second direction), the first disconnection element area FA1 is provided on the direction D2 side of the first resistor element area RA1, and the second disconnection element area FA2 is provided on the direction D2 side of the second resistor element area RA2.

According to the layout arrangement shown in FIG. 7, since the first and second disconnection element areas FA1 and FA2 are disposed linearly along the direction D1, for example, the efficiency of the fuse blowing step can be increased, whereby the process time can be reduced. For example, when the direction D1 is referred to as a direction X and the direction D2 is referred to as a direction Y, since the fuse can be blown while changing only the X coordinate without changing the Y coordinate, the fuse blowing step can be simplified and increased in speed.

According to the layout arrangement shown in FIG. 7, the areas FA1 and RA1 and the areas FA2 and RA2 are provided symmetrically with respect to a centerline SL (centerline between the DP and DM pads). This enables matching between the DP-side terminating resistors (R1, R12, R13, . . . ) and the DM-side terminating resistors (R2, R22, R23, . . . ), whereby a more appropriate impedance matching can be realized. As a result, a skew between the differential signal pair can be minimized, for example.

According to the layout arrangement shown in FIG. 7, since the first disconnection element area FA1 is provided on the direction D2 side of the first resistor element area RA1, the areas FA1 and RA1 can be interconnected through a short path. Likewise, since the second disconnection element area FA2 is provided on the direction D2 side of the second resistor element area RA2, the areas FA2 and RA2 can be interconnected through a short path. This increases wiring efficiency, whereby the layout area can be reduced. As described above, the layout arrangement shown in FIG. 7 enables an increase in efficiency of the fuse blowing step and a reduction in layout area in combination.

Figure 8:
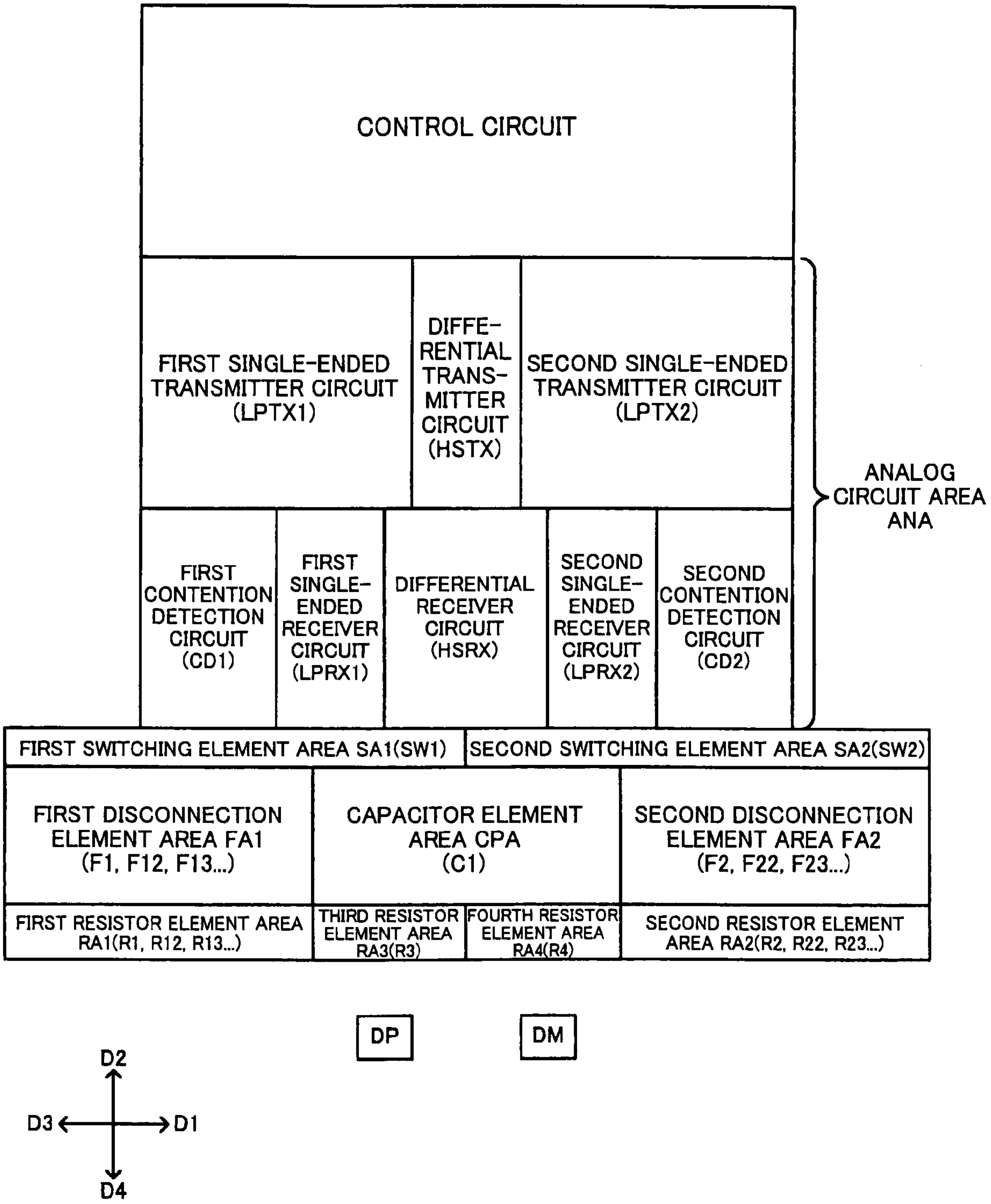
FIG. 8 shows a detailed layout arrangement example of an interface circuit and a resistor circuit.

FIG. 8 shows a detailed layout arrangement example of the interface circuit 1 and the resistor circuit 100.

In FIG. 8, the first and second resistor element areas RA1 and RA2 are provided along the direction D1, and the first and second disconnection element areas FA1 and FA2 are also provided along the direction D1 in the sane manner as in FIG. 7. The area FA1 is provided on the direction D2 side of the area RA1, and the area FA2 is provided on the direction D2 side of the area RA2.

In FIG. 8, the capacitor C1 (capacitor element) is disposed in a capacitor element area CPA provided between the first disconnection element area FA1 and the second disconnection element area FA2. When the direction opposite to the direction D2 is referred to as a direction D4 (fourth direction), the resistors R3 and R4 (third and fourth resistor elements) are disposed in third and fourth resistor element areas RA3 and RA4 provided on the direction D4 side of the capacitor element area CP1.

According to the layout arrangement shown in FIG. 8, since the capacitor C1 can be disposed utilizing the space which is the free space between the first and second disconnection element areas FA1 and FA2 and is the free space on the direction D2 side of the third and fourth resistor element areas RA3 and RA4, the layout efficiency can be increased. Moreover, since the DP-side areas and the DM-side areas can be disposed symmetrically with respect to the centerline SL described with reference to FIG. 7, a skew between the differential signal pair can be minimized while achieving impedance matching, whereby the differential signal transfer characteristics can be increased.

According to the layout arrangement shown in FIG. 8, since the areas FA1, RA1, and RA3 and the areas FA2, RA2, and RA4 can be interconnected through a short signal path, the wiring efficiency can be increased. Moreover, the effects of parasitic resistance and parasitic capacitance can be minimized.

In FIG. 8, the comparator circuit 200 is disposed in an analog circuit area ANA provided on the direction D2 side of the capacitor element area CPA. Specifically, in FIG. 8, an area AAN in which the analog circuits (analog front-end circuits) such as the differential receiver circuit HSRX formed by the comparator circuit 200 are disposed is provided on the direction D2 side of the capacitor element area CPA (areas FA1 and FA2). According to this configuration, since the elements and the circuits forming the resistor circuit 100 and the elements and the circuits forming the analog circuit can be separately disposed in different areas, it is possible to achieve an increase in layout efficiency, prevention of deterioration in analog circuit characteristics, and the like.

In FIG. 8, the differential receiver circuit HSRX is disposed in the area between the differential transmitter circuit HSTX and the capacitor element area CPA. Therefore, the differential receiver circuit HSRX can be disposed close to the resistor circuit 100, whereby the parasitic resistance which affects the terminating resistor can be minimized.

In FIG. 8, the transmission gates SW1 and SW2 are disposed in first and second switching element areas SA1 and SA2 provided between the capacitor element area CPA (areas FA1 and FA2) and the analog circuit area ANA. This enables the transmission gates SW1 and SW2 to be disposed at positions away from the DP and DM pads (bumps). Therefore, when static electricity is applied to the DP and DM pads, the static electricity is reduced by the resistors R3 and R4 in the third and fourth resistor element areas RA3, and RA4, and is then transmitted to the transmission gates SW1 and SW2. This further increases electrostatic discharge withstand voltage.

Figure 9:
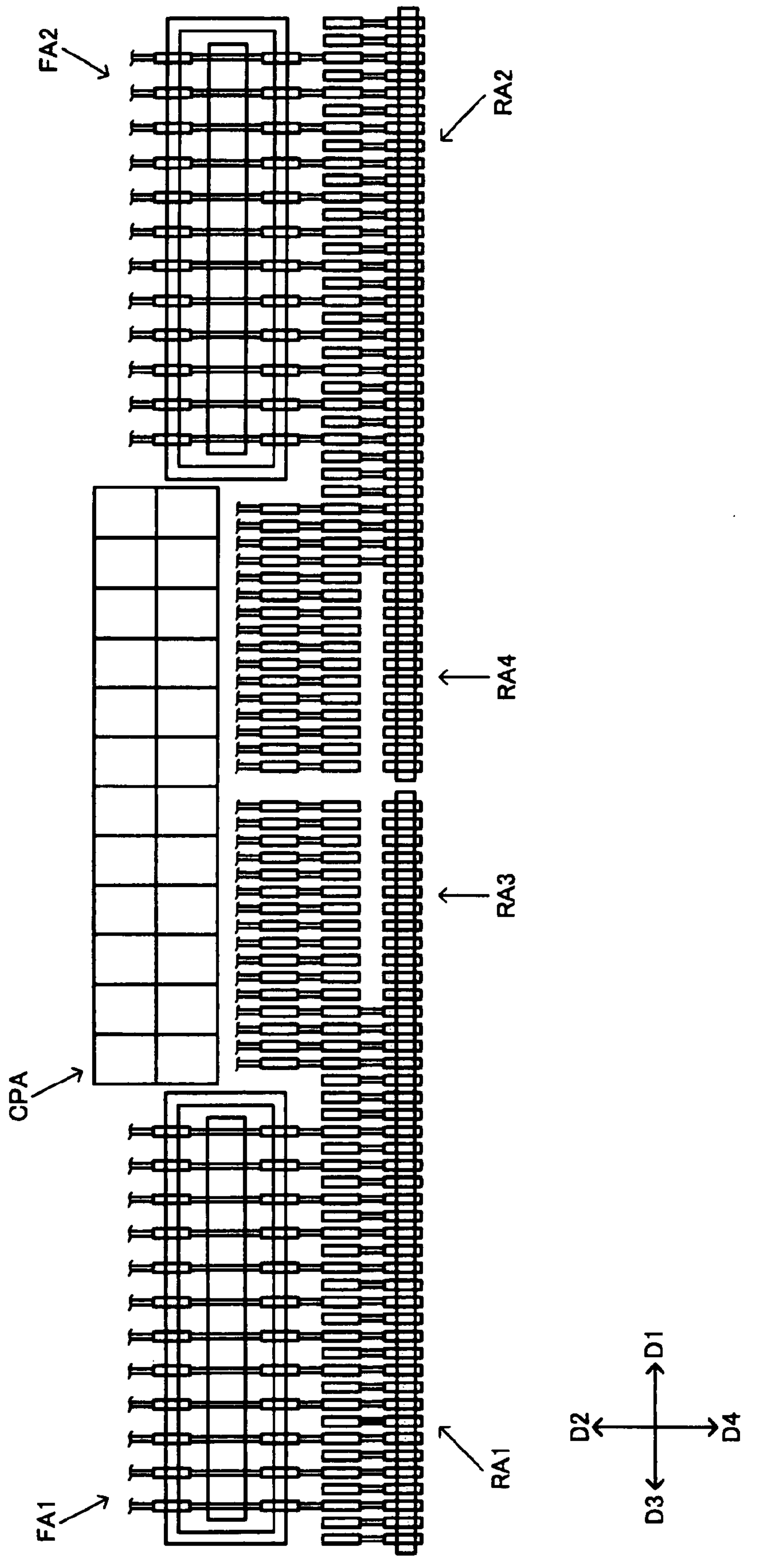

FIG. 9 shows a further detailed layout example of the disconnection element areas FA1 and FA2, the resistor element areas RA1, RA2, RA3, and RA4, and the capacitor element area CPA.

As shown in FIG. 9, the fuses in the disconnection element areas FA1 and FA2 are disposed along the direction D1. A guard ring for improving moisture absorption properties is formed around the fuses. The guard ring may be formed using metal wiring layers and vias (contacts) connecting the metal wiring layers, for example.

Specifically, a fuse window is formed in an area in which the fuses may be blown. Therefore, moisture from the outside may enter the interface circuit through the fuse window (i.e., interlayer dielectric exposed in the fuse window), thereby causing deterioration, destruction, and the like of the internal circuit.

On the other hand, when forming the guard ring outside of the fuse elements, the guard ring serves as a barrier to prevent entrance of moisture and the like from the outside.

When providing the guard ring, the interconnect which connects the resistor and the fuse element or the like necessarily has an interconnect portion formed over the guard ring. In FIG. 9, a polysilicon interconnect unit in the same layer as the polysilicon unit forming the resistor is used as such an interconnect portion, for example. Specifically, a polysilicon interconnect unit having the same shape as the polysilicon resistor unit is used as such an interconnect portion. This further increases the adjustment accuracy of the resistance value of the resistor circuit.

The layout arrangement methods described with reference to FIGS. 7, 8, and 9 may also be applied to the configuration of the comparative example shown in FIG. 4 in addition to the first to third configuration examples shown in FIGS. 1 to 3. For example, the layout arrangement method according to this embodiment may be applied to an interface circuit including a resistor circuit formed of n-stage unit circuits, each of which includes first and second disconnection elements and first and second resistor elements. In this case, it suffices that each unit circuit include first and second disconnection elements, a first resistor element of which one end is connected with a first interconnect and the other end is connected with one end of the first disconnection element, and a second resistor element of which one end is connected with a second interconnect and the other end is connected with one end of the second disconnection element, for example.

6. Electronic Instrument

Figure 10A:
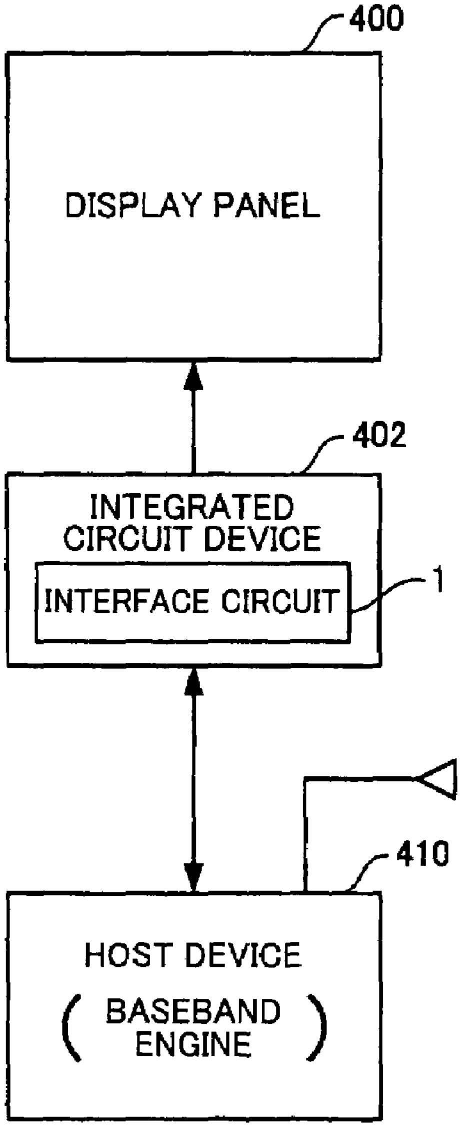
FIGS. 10A and 10B show configuration examples of an electronic instrument.
Figure 10B:
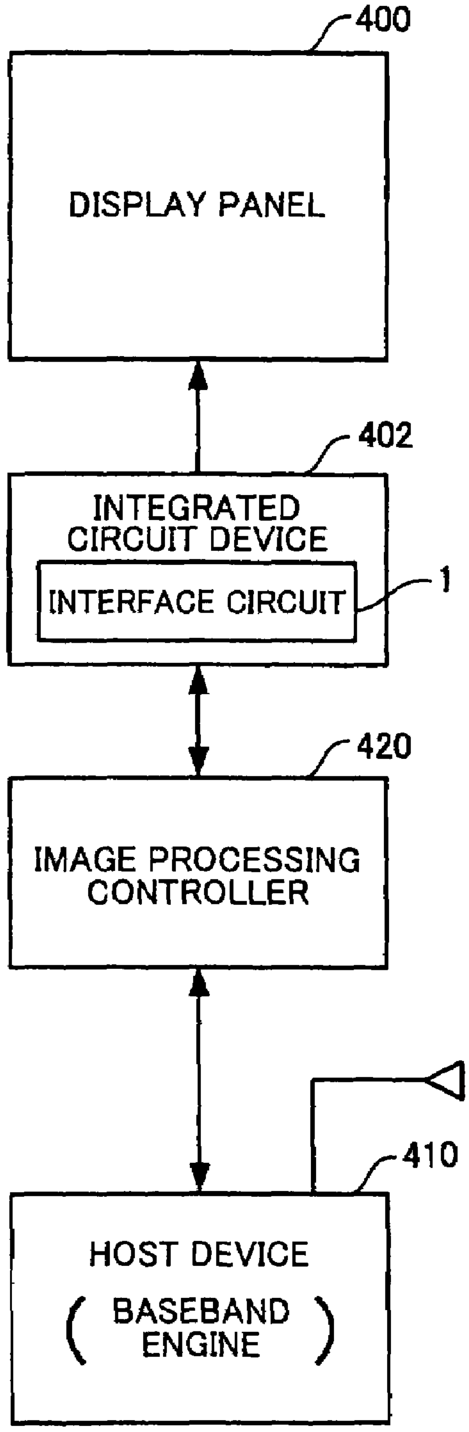

FIGS. 10A and 10B show examples of an electronic instrument (electro-optical device) including the interface circuit 1 according to this embodiment. The electronic instrument may include elements (e.g. camera, operation section, or power supply) other than the elements shown in FIGS. 10A and 10B. The electronic instrument according to this embodiment is not limited to a portable telephone, but may be a digital camera, a PDA, an electronic notebook, an electronic dictionary, a projector, a rear-projection television, a portable information terminal, or the like.

In FIGS. 10A and 10B, a host device 410 is an MPU, a baseband engine, or the like. The host device 410 controls an integrated circuit device 402 such as a display driver. The host device 410 may also perform a process of an application engine or a baseband engine or a process of a graphic engine, such as compression, decompression, and sizing. An image processing controller 420 shown in FIG. 10B performs a process of a graphic engine, such as compression, decompression, or sizing, instead of the host device 410.

In FIG. 10A, an integrated circuit device including a memory may be used as the integrated circuit device 402. In this case, the integrated circuit device 402 writes image data from the host device 410 into the built-in memory, and reads the written image data from the built-in memory to drive a display panel 400. In FIG. 10B, an integrated circuit device which does not include a memory may be used as the integrated circuit device 402. In this case, image data from the host device 410 is written into a built-in memory of the image processing controller 420. The integrated circuit device 402 drives the display panel 400 under control of the image processing controller 420.

As shown in FIGS. 10A and 10B, the interface circuit 1 according to this embodiment is provided in the integrated circuit device 402. The interface circuit 1 implements a high-speed data transfer using differential signals between the host device 410 or the image processing controller 420 and the integrated circuit device 402.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings. The invention also includes any combination of the configuration examples according to this embodiment. The configurations and the arrangement of the resistor circuit, the interface circuit, and the electronic instrument are not limited to those described in this embodiment. Various modifications and variations may be made.

What is claimed is:

1. A resistor circuit comprising:

n-stage (n is a positive integer equal to or larger than two) unit circuits, each of the n-stage unit circuits including:

a first resistor element provided between a first terminal and a second terminal;

a first disconnection element provided between the second terminal and a third terminal; and a second disconnection element and a second resistor element provided in series between the second terminal and a fourth terminal;

the first terminal of each of the n-stage unit circuits being connected with a first interconnect;

the fourth terminal of each of the n-stage unit circuits being connected with a second interconnect;

the third terminal of a first-stage unit circuit of the n-stage unit circuits being connected with a third interconnect; and the third terminal of an mth-stage (m is a positive integer satisfying $2 \leqq m \leqq n$) unit circuit of the n-stage unit circuits being connected with the second terminal of an (m−1)th-stage unit circuit of the n-stage unit circuits.

2. The resistor circuit as defined in claim 1, the first resistor elements of the n-stage unit circuits being disposed in a first resistor element area, the second resistor elements of the n-stage unit circuits being disposed in a second resistor element area, the first disconnection elements of the n-stage unit circuits being disposed in a first disconnection element area, the second disconnection elements of the n-stage unit circuits being disposed in a second disconnection element area, the first resistor element area and the second resistor element area being provided along a first direction, the first disconnection element area and the second disconnection element area being provided along the first direction, and when a direction perpendicular to the first direction is a second direction, the first disconnection element area being provided on the second direction side of the first resistor element area, and the second disconnection element area being provided on the second direction side of the second resistor element area.

3. An interface circuit comprising:

the resistor circuit as defined in claim 1;

a comparator circuit that includes a first input terminal and a second input terminal and in which the resistor circuit serving as a terminating resistor is provided between the first input terminal and the second input terminal;

a third resistor element provided between the first input terminal of the comparator circuit and the third interconnect;

a fourth resistor element provided between the second input terminal of the comparator circuit and the third interconnect; and a capacitor element provided between the third interconnect and a ground potential line.

4. The interface circuit as defined in claim 3, comprising:

a first switching element provided between the first input terminal of the comparator circuit and the first interconnect; and a second switching element provided between the second input terminal of the comparator circuit and the second interconnect;

the third resistor element being provided between the first interconnect and the third interconnect, and the fourth resistor element being provided between the second interconnect and the third interconnect.

5. The interface circuit as defined in claim 4, comprising:

a fifth resistor element provided between the first input terminal of the comparator circuit and a first external terminal; and a sixth resistor element provided between the second input terminal of the comparator circuit and a second external terminal.

6. The interface circuit as defined in claim 4, comprising:

a first single-ended receiver circuit connected with the first input terminal of the comparator circuit; and a second single-ended receiver circuit connected with the second input terminal of the comparator circuit;

the comparator circuit forming a differential receiver circuit, and the first and second switching elements being turned ON when the differential receiver circuit receives signals, and the first and second switching elements being turned OFF when the first and second single-ended receiver circuits receive signals.

7. The interface circuit as defined in claim 3, comprising:

a first switching element provided between the first interconnect and the third interconnect; and a second switching element provided between the second interconnect and the third interconnect;

the third resistor element being provided between the first input terminal of the comparator circuit and the first interconnect, and the fourth resistor element being provided between the second input terminal of the comparator circuit and the second interconnect.

8. The interface circuit as defined in claim 7, comprising:

a first single-ended receiver circuit connected with the first input terminal of the comparator circuit; and a second single-ended receiver circuit connected with the second input terminal of the comparator circuit;

the comparator circuit forming a differential receiver circuit, and the first and second switching elements being turned ON when the differential receiver circuit receives signals, and the first and second switching elements being turned OFF when the first and second single-ended receiver circuits receive signals.

9. The interface circuit as defined in claim 3, wherein:

the first disconnection elements of the n-stage unit circuits are disposed in a first disconnection element area;

the second disconnection elements of the n-stage unit circuits are disposed in a second disconnection element area; and the capacitor element is disposed in a capacitor element area provided between the first disconnection element area and the second disconnection element area.

10. The interface circuit as defined in claim 9, the first resistor elements of the n-stage unit circuits being disposed in a first resistor element area, the second resistor elements of the n-stage unit circuits being disposed in a second resistor element area, the first resistor element area and the second resistor element area being provided along a first direction, the first disconnection element area and the second disconnection element area being provided along the first direction, and when a direction perpendicular to the first direction is a second direction, the first disconnection element area being provided on the second direction side of the first resistor element area, and the second disconnection element area being provided on the second direction side of the second resistor element area.

11. The interface circuit as defined in claim 10, when a direction opposite to the second direction is a fourth direction, the third and fourth resistor elements being respectively disposed in third and fourth resistor element areas provided on the fourth direction side of the capacitor element area.

12. The interface circuit as defined in claim 10, the comparator circuit being disposed in an analog circuit area provided on the second direction side of the capacitor element area.

13. An electronic instrument comprising the interface circuit as defined in claim 3.

14. The resistor circuit as defined in claim 1, at least one of the disconnection element and the second disconnection element being disconnected.

15. The resistor circuit as defined in claim 14, the first resistor element of the n-stage unit circuits and the second resistor element of the n-stage unit circuits being provided along a first direction, the first fuse of the n-stage unit circuits and the second fuse of the n-stage unit circuits being provided along the first direction, and when a direction perpendicular to the first direction is a second direction, the first fuse of the n-stage unit circuits being provided on the second direction side of the first resistor element of the n-stage unit circuits, and the second fuse of the n-stage unit circuits being provided on the second direction side of the second resistor element of the n-stage unit circuits.

16. An interface circuit comprising:

a resistor circuit including n-stage (n is a positive integer equal to or larger than two) unit circuits, each of the n-stage unit circuits including first and second disconnection elements, a first resistor element of which one end is connected with a first interconnect and the other end is connected with one end of the first disconnection element, and a second resistor element of which one end is connected with a second interconnect and the other end is connected with one end of the second disconnection element;

a comparator circuit that includes a first input terminal and a second input terminal and in which the resistor circuit serving as a terminating resistor is provided between the first input terminal and the second input terminal;

a third resistor element provided between the first input terminal of the comparator circuit and a third interconnect;

a fourth resistor element provided between the second input terminal of the comparator circuit and the third interconnect; and a capacitor element provided between the third interconnect and a ground potential line;

the first disconnection elements of the n-stage unit circuits being disposed in a first disconnection element area, the second disconnection elements of the n-stage unit circuits being disposed in a second disconnection element area, the capacitor element being disposed in a capacitor element area provided between the first disconnection element area and the second disconnection element area, the capacitor element area being provided on a first direction side of the first disconnection element area, the second disconnection element area being provided on the first direction side of the capacitor element area, the first resistor elements of the n-stage unit circuits being disrosed in a first resistor element area, the second resistor elements of the n-stage unit circuits being disrosed in a second resistor element area, the first resistor element area and the second resistor element area being provided along the first direction, the first disconnection element area and the second disconnection element area being provided along the first direction, and when a direction perpendicular to the first direction is a second direction, the first disconnection element area being provided on the second direction side of the first resistor element area, and the second disconnection element area being provided on the second direction side of the second resistor element area.

17. The interface circuit as defined in claim 16, when a direction opposite to the second direction is a fourth direction, the third and fourth resistor elements being respectively disposed in third and fourth resistor element areas provided on the fourth direction side of the capacitor element area.

18. The interface circuit as defined in claim 16, the comparator circuit being disposed in an analog circuit area provided on the second direction side of the capacitor element area.

19. An electronic instrument comprising the interface circuit as defined in claim 16.

20. A resistor circuit comprising:

n-stage (n is a positive integer equal to or larger than two) unit circuits, each of the n-stage unit circuits including:

a first resistor element provided between a first terminal and a second terminal;

a first fuse provided between the second terminal and a third terminal; and a second fuse and a second resistor element provided in series between the second terminal and a fourth terminal;

the first terminal of each of the n-stage unit circuits being connected with a first interconnect;

the fourth terminal of each of the n-stage unit circuits being connected with a second interconnect;

the third terminal of a first-stage unit circuit of the n-stage unit circuits being connected with a third interconnect; and the third terminal of an mth-stage (m is a positive integer satisfying $2 \leqq m \leqq n$) unit circuit of the n-stage unit circuits being connected with the second terminal of an (m−1)th-stage unit circuit of the n-stage unit circuits.

* * * * *